United States Patent
Ahmad et al.

(10) Patent No.: US 8,099,638 B2
(45) Date of Patent: Jan. 17, 2012

(54) APPARATUS AND METHODS FOR TUNING A MEMORY INTERFACE

(75) Inventors: Sagheer Ahmad, Sunnyvale, CA (US); Eric Scott, San Francisco, CA (US); Joe Macri, San Francisco, CA (US); Dan Shimizu, Santa Barbara, CA (US)

(73) Assignee: ATI Technologies ULC, Markham, Ontario (CA)

( * ) Notice: Subject to any disclaimer, the term of this patent is extended or adjusted under 35 U.S.C. 154(b) by 395 days.

(21) Appl. No.: 10/987,499

(22) Filed: Nov. 12, 2004

(65) Prior Publication Data

US 2006/0106948 A1 May 18, 2006

(51) Int. Cl.
*G11C 29/12* (2006.01)
*G06F 12/00* (2006.01)

(52) U.S. Cl. .......................... 714/718; 711/217
(58) Field of Classification Search .................. None
See application file for complete search history.

(56) References Cited

U.S. PATENT DOCUMENTS

| | | | |
|---|---|---|---|
| 6,198,669 B1 | 3/2001 | Iguchi | |
| 6,674,378 B2 * | 1/2004 | Johnson et al. | 341/120 |
| 7,210,059 B2 * | 4/2007 | Jeddeloh | 714/5 |
| 7,444,559 B2 * | 10/2008 | Swanson et al. | 714/718 |
| 2004/0133827 A1 | 7/2004 | Norris et al. | |

OTHER PUBLICATIONS

European Search Report dated Mar. 17, 2006 for European Application No. EP05256781, pp. 1-6.
IBM Technical Disclosure Bullein; Memory-Testing Mechanism for Computer Systems; Jun. 1, 1993; pp. 345-347.
EP Office Action; for EP Application No. 08019216.4; dated Sep. 21, 2009.

* cited by examiner

*Primary Examiner* — Gary Portka
(74) *Attorney, Agent, or Firm* — Baker & Daniels LLP

(57) ABSTRACT

The disclosure relates to a programmable virtual memory client, that includes programmable control logic configured to generate at least one data pattern sequence from a number of stored data patterns. Additionally, the virtual memory client includes virtual memory client control logic configured to use the generated at least one data pattern sequence to at least one of read from and write to at least one memory device. A method includes generating at least one data pattern sequence from a number of stored data patterns and writing and reading the data pattern sequence from and to a memory device.

20 Claims, 7 Drawing Sheets

US 8,099,638 B2

APPARATUS AND METHODS FOR TUNING A MEMORY INTERFACE

FIELD OF THE INVENTION

The present disclosure relates to apparatus and methods for tuning memory interfaces and, more particularly, to a virtual memory client and accompanying method that tests and tunes performance of a memory interface.

BACKGROUND OF THE INVENTION

Memory interfaces that are used to connect a memory device with some other circuit or device, such as an integrated circuit, contain numerous inputs and outputs (such as "pads", which are the connection points to the integrated circuit) for data lines used to write and read data to a memory device, as well as clock and strobe signals, and command and address data. In particular, a memory interface may be tuned through the use of adjustable delay lines and by adjusting pad driving strengths to optimize the performance of the memory interface. This becomes particularly important when interfacing with memory devices such as double data rate (DDR) SDRAMs or other high speed data devices where the aggregation of time and delays degrade the performance of the memory interface.

In order to optimize the performance of a memory interface, it is known to tune or find the optimal values of parameters such as the delay line timing and pad drive strength in order to optimize the memory interface. The process of tuning the memory interface may be performed manually, but this process is time consuming and requires external equipment connected to the memory interface. In order to make tuning less onerous, it is known to employ a built-in self test (BIST or an MCBIST for a memory controller, in particular) on an integrated circuit to test the memory interface without external equipment. Such BISTs, however, are typically not programmable in a significant manner and are implemented to utilize resources of the chip in which the BIST is located that are normally used for other functions of the chip. Moreover, known BISTs employ fixed data patterns to test the memory interface. Accordingly, these BISTs cannot provide deterministic worst case data patterns that more likely ensure testing of the memory interface is robust and thorough.

BRIEF DESCRIPTION OF THE DRAWINGS

The present disclosure will be more readily understood in view of the following description when accompanied by the below figures and wherein like reference numerals represent like elements.

DETAILED DESCRIPTION OF THE PRESENT EMBODIMENTS

The present disclosure relates to memory test logic or programmable virtual memory client, which is similar to a BIST, but includes programmable control logic configured to generate at least one data pattern sequence from a plurality of stored data patterns. Additionally, the virtual memory client includes a virtual memory client control logic configured to use the generated at least one data pattern sequence to at least one of read from and write to at least one memory device.

The disclosed programmable virtual memory client is employable on an integrated circuit, such as a video graphics processor or other suitable integrated circuit, for example, and may be configured to automatically tune delay lines and drive strengths of a memory interface connecting the integrated circuit to a memory device or for inclusion in the memory device or as a separate integrated circuit between another integrated circuit and memory. The integrated circuit may include one or more virtual memory clients in accordance with the present disclosure that include programmability allowing efficient generation of deterministic worst case data patterns (or other levels of data patterns) for more robust testing as well as automatic tuning of the delay line and pad drive strengths in order to account for variables such as the integrated circuit board variables, the memory device, the ASIC type, and process, voltage and temperature variations.

Figure 1:
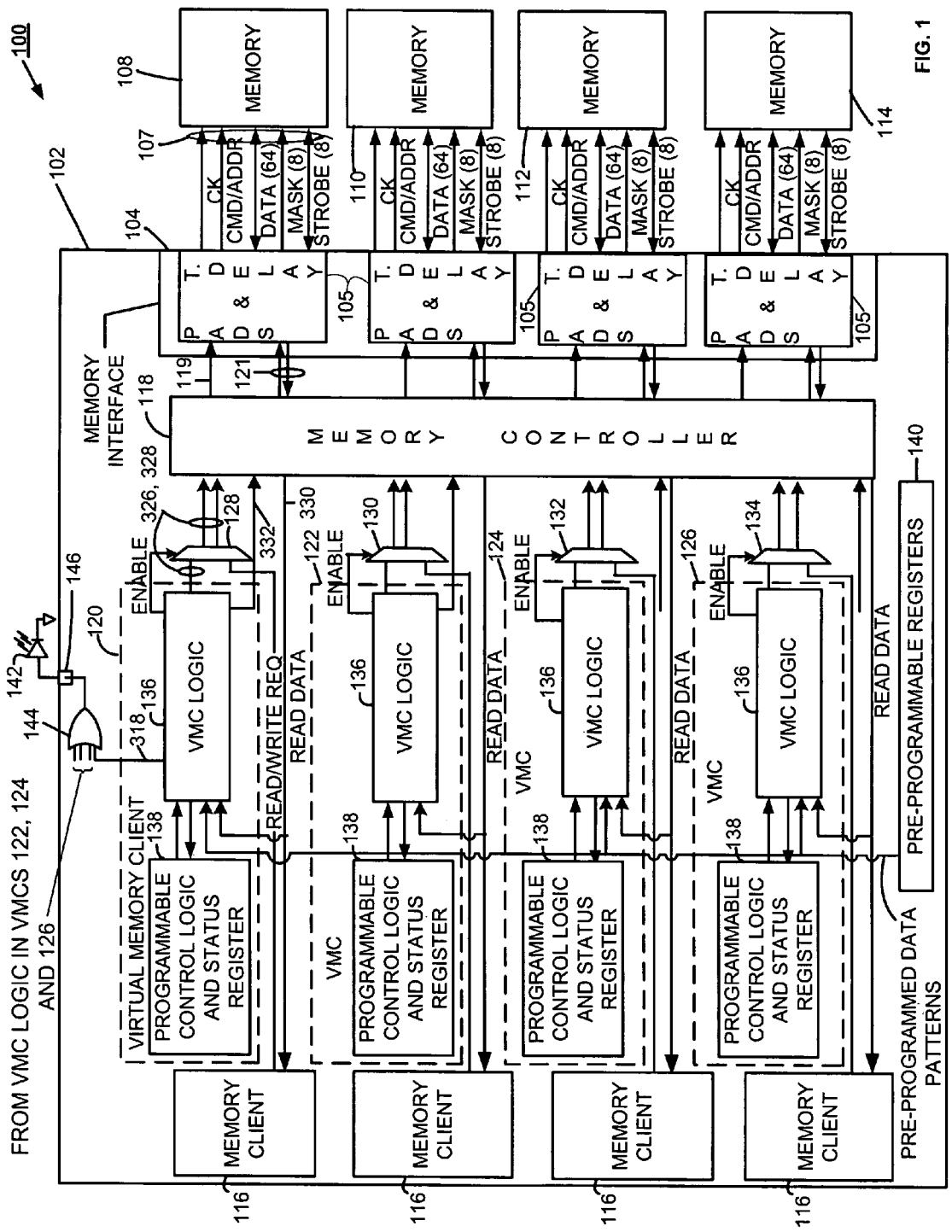
FIG. 1 illustrates a system having an integrated circuit employing virtual memory clients in accordance with the present disclosure.

FIG. 1 illustrates a system 100 including an integrated circuit 102 having a memory interface 104 that effects reading and writing of data between the integrated circuit 102 and a number of memory devices 108, 110, 112, and 114. Included in the memory interface 104 are series of pads (i.e., physical connections to busses 107 between the interface 104 and memory devices) 105. The series of pads 105 are configured such that the pad strength (the intensity of the signals on the pads) and time delay may be adjusted or tuned by the memory controller or any other suitable device, whether in the circuit 102 or external to the circuit 102.

The integrated circuit 102 may include a number of memory clients 116, which utilize memory resources of the memory devices. That is, the memory clients 116 read and write data to the memory devices 108, 110, 112, 114 via a memory controller 118, a control bus 119, a data bus 121 for reading/writing, and the memory interface 104. The integrated circuit 102 also includes a number of virtual memory clients 120, 122, 124, and 126. These virtual memory clients are implemented as hardware on the integrated circuit 102 and may be substituted for the memory clients 116 using a multiplexer device (e.g., multiplexers 128, 130, 132, and 134) for the purpose of testing and tuning the interface 104 switched by an ENABLE signal from the virtual memory clients 120, 122, 124, and 126. It is noted, however, that the virtual memory clients may be implemented in an integrated circuit 102 having no memory clients 116 in the circuit 102 or memory clients not yet developed on the chip 102.

Although it is possible to utilize only one programmable virtual memory client in order to effect tuning of the memory interface 104, the system 100 in FIG. 1 illustrates four virtual memory clients 120, 122, 124, and 126. By implementing more than one virtual memory client, the likelihood is greater that a deterministic worst case data pattern for testing of the memory interface will be generated. Each of the programmable virtual memory clients includes virtual memory control logic 136 that effects the functions of the virtual memory client. In addition, each virtual memory client (120, 122, 124, and 126) contains programmable control logic and status register 138. In particular, the programmable control logic and status register 138 is used to program the operation of virtual memory client logic 136. In the example of FIG. 1, once a virtual memory client (VMC), such as virtual memory client 120, is programmed to run, the VMC 120, in this example, replaces the memory client 116 and behaves like a memory read/write client for purposes of testing and tuning the memory interface 104. In connection with the programming of each virtual memory client through the programmable control logic and status register 138, the integrated circuit 102 also includes pre-programmable registers 140 that may be preprogrammed with data patterns by a user for use in generating data pattern sequences usable by the virtual memory clients.

Figure 2:
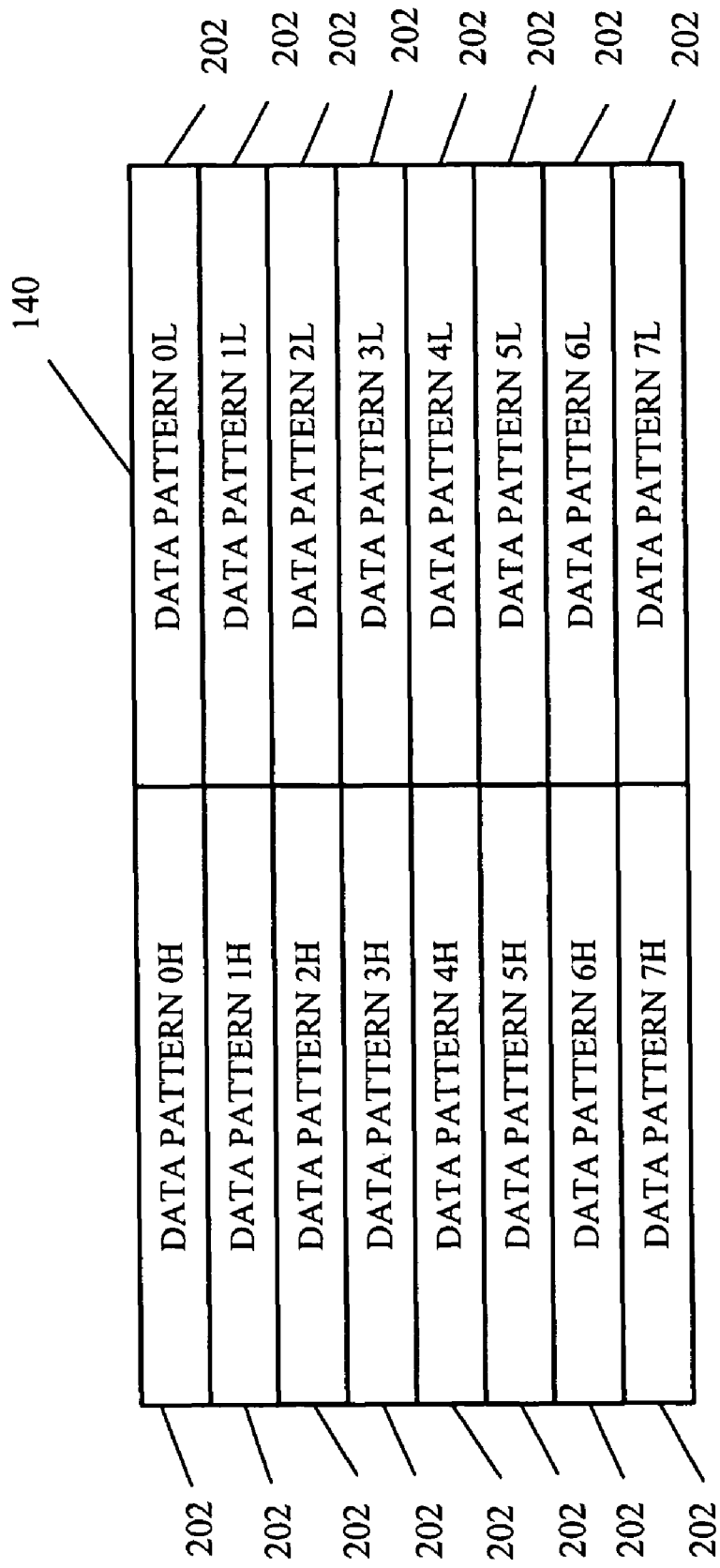
FIG. 2 illustrates one example of a pre-programmed register utilized in the circuit of FIG. 1.

In this particular example, the pre-programmable registers 140 may include sixteen 32-bit programmable data registers 202 each containing a particular pattern of the 32 bits (e.g., DATA PATTERN OH, DATA PATTERN OL, etc.) as illustrated in FIG. 2. Each of the patterns is different from the other patterns stored in the other data registers 202. Although sixteen data registers are shown, more or less registers may be used. The use of sixteen data patterns, however, sufficiently ensures that data pattern sequences generated by the virtual memory clients will be varied enough to effectively generate a type of deterministic worst case data pattern to be sent to the memory interface 104.

Figure 3:
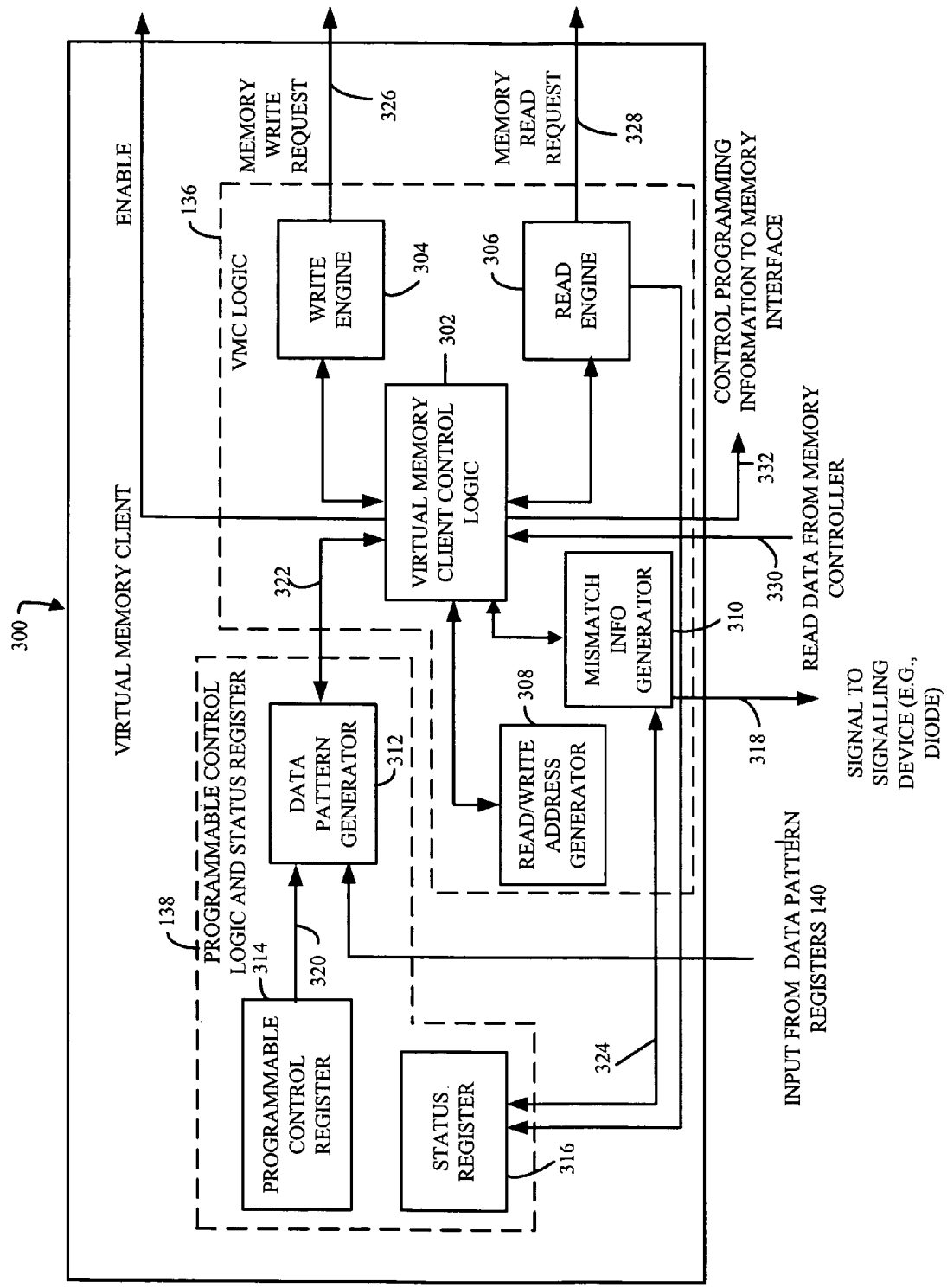
FIG. 3 illustrates a functional block diagram of one example of a virtual memory client in accordance with the present disclosure.

FIG. 3 illustrates an example of a functional block diagram of functional portions within virtual memory client 300. This virtual memory client 300 shown is exemplary for the virtual memory clients 120, 122, 124, and 126 illustrated in FIG. 1. VMC logic 136 includes a virtual memory client control logic 302 used to control operations of the virtual memory client 300. Additionally, the virtual memory client 300 includes a write engine 304 used to issue memory write requests and send data pattern sequences to the memory interface 104. A read engine 306 is also provided within the VMC logic 136 in order to issue memory read requests to the memory interface 104 for reading data pattern sequences out of the memory devices (e.g., memory device 108). Data read from the memory controller 118, which have first been read from the memory devices are fed to the virtual memory client control logic 302. The VMC logic 136 also contains a read/write address generator 308 that is used to generate addresses for writing to or reading from memory devices 108 the data pattern sequences during the testing and tuning processes. The VMC logic 136 also contains a mismatch information generator 310 used to determine mismatches between data pattern sequences written to memory and corresponding data pattern sequences read from memory.

Within the programmable control logic and status register 138, a data pattern generator 312 is included to receive pattern input data from the data pattern pre-programmable registers 140 illustrated in FIG. 1. Also within the programmable control logic and status register 138 is a programmable control register 314. This control register 314, which typically includes two registers, is used to control the data pattern generator 312 in order to generate programmed data pattern sequences. Each of the control registers within the programmable control register 314 has, in this example, an eight data pattern multiplexed selector, which is used to generate two bursts of data for writing data to the memory devices in the case of a write request or for comparing with data sequences read from the memory devices 108 in the case of a request. In this example, each burst is 256 bits of data. This number of bits may be more or less, but the use of more bits ensures the generation of a deterministic worst case data pattern. In particular, by using at least two bursts of data with each burst having 256 bits of a data pattern sequence, it is possible to program most known data patterns, from a signal integrity perspective, by repeating bursts of these two data patterns. According to one implementation, the programmable control register 314 generates an odd or first burst that includes four cycles of 64-bit data. Each of the cycles includes two 32-bit data patterns selected from the pre-programmable registers 140 by the programmable control register 314. Once the selections are communicated by the register 314 to the data pattern generator 312 as indicated by bus 320, the data pattern generator 312 assembles the cycles into the 256-bit burst and sends the assembled burst to the virtual memory client control logic 302 as indicated by bus 322 for either writing or comparing.

FIG. 3 also illustrates that the virtual memory client 300 includes a status register 316, which is used to store mismatch information generated by the mismatch information generator 310 and communicated by connection 324. In the disclosed example, the status register 316 includes 68 bits of readable registers. Specifically, 64 bits of register 316 may be used to store the mismatch-data that yielded as a result of mismatch between the comparison of the received data and the expected data (which is performed by the read engine 306). Additionally, 32 bits of the register 316 may be used to store the 32-bit address of the first mismatched address found during a current looping cycle.

Another two bits of the status register 316 may contain priority encoded information concerning the result of an ORing operation of each cycle in a burst and for each of the four cycles in the burst. Additionally, one bit of the status register 316 may be used to indicate whether the mismatch is associated with the odd or the even burst. Thus, with these three bits of information, the exact occurrence of where the mismatch is associated is stored (i.e., that the mismatch occurs in either the odd or even burst and in which of the four cycles within the odd or even burst the mismatch has occurred).

Finally, the status register 316 may include a one bit "sticky" register that is made "TRUE" in the case of a read mismatch and remains TRUE until reset. This one bit of information is polled by the mismatch information generator 310, which then issues signal 318 when the bit is TRUE for purposes of signaling a mismatch to a user. As an example, this mismatch signal can be used to cause a signaling light emitting diode, such as diode 142 shown in FIG. 1, to turn on in order to assist a user in tuning the memory interface with a visual indication. Alternatively, the signal 318 could also be used to trigger a continuously recording external signal recording device (e.g., an oscilloscope w/memory) to stop recording, thus capturing what a data signal waveform in the interface 104 looks like when it fails. Thus, this alternative is an example where the mismatch is not only communicated by a visual indication to the user, but rather to automated equipment. It this case, the VMC engines can be used as part of a testing apparatus for testing the memory interface, such as an ATE (automatic test equipment) type of system. This provides a much quicker and more apparent failure signal. One of ordinary skill in the art will appreciate, however, that the signal 318 may be used to initiate signaling using any suitable device to communicate mismatch to a user or suitable testing apparatus.

Figure 4:
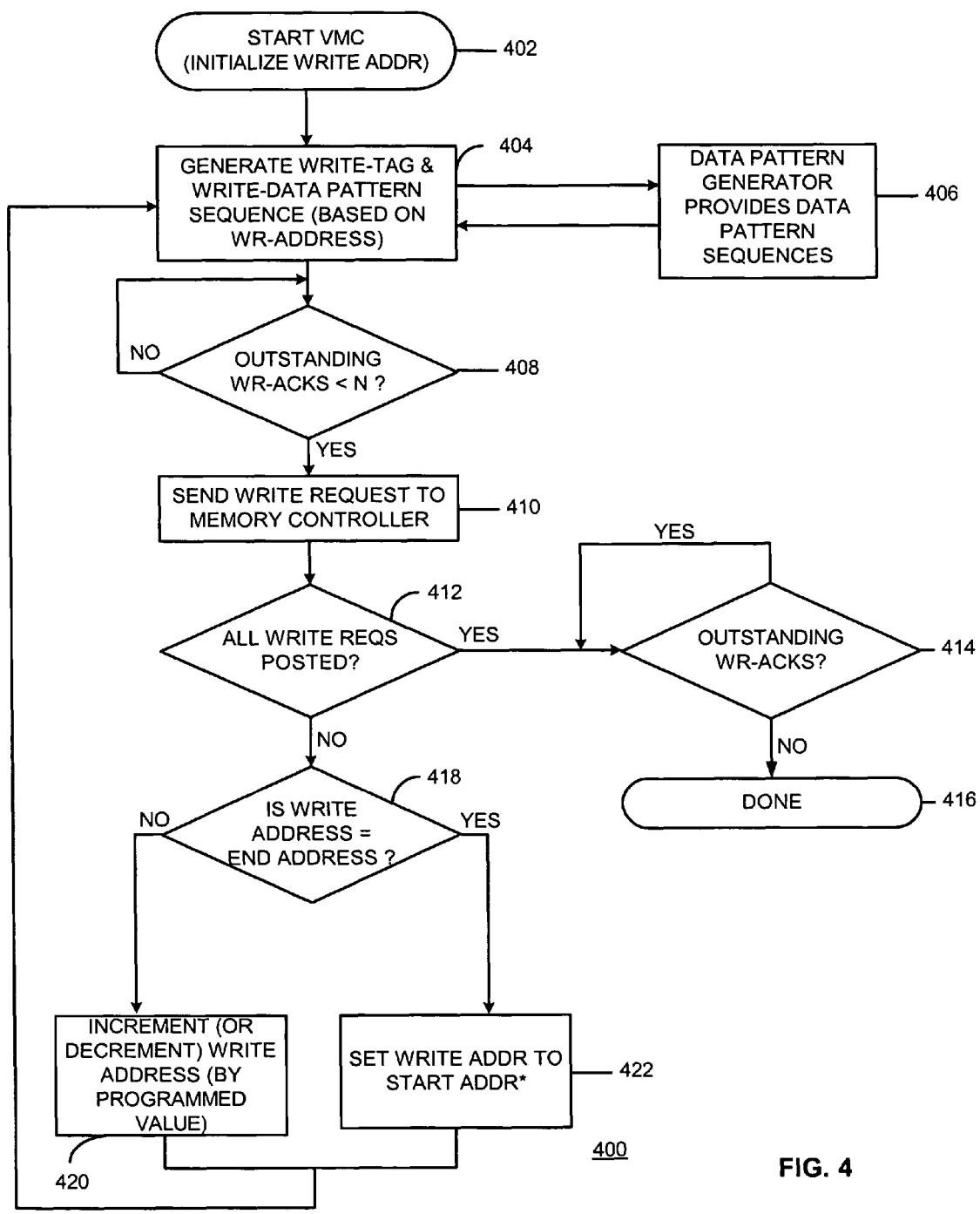
FIG. 4 is a flow diagram of the operation of one example of a write engine employed in the virtual memory client illustrated in FIG. 2.

In order to write and read data pattern sequences to the memory devices, each of the virtual memory client logic 136 include a write engine 304 and a read engine 306. FIG. 4 illustrates the operation of the write engine 304. As shown in FIG. 4, when a write operation is initiated by the virtual memory client control logic 302, the write engine 304 is initialized as shown in block 402. The write address is initialized at a starting address to which the virtual memory client will write the data pattern sequences or bursts. After initialization, the write engine 304 generates a write tag and accesses the write data pattern sequence as indicated at block 406, where the data pattern generator provides the data pattern sequence. The write engine 304 next determines whether the number of outstanding write acknowledgements (WR-ACKS) is less than a predetermined number N as illustrated in decision block 408. If there are too many outstanding write acknowledgements, the flow loops back to block 408 until the number of write acknowledgements has decreased below the value N. In the present example, N is equal to 255 based on the write buffering capability of the memory controller, but this number could be more or less. It is also noted that write engine 304 generates unique tags for all outstanding write-requests, therefore having bigger value of N would require more complex logic to generate unique tags. Once the number of outstanding write acknowledgements is less than the predetermined number N, the write engine 304 sends the write request over bus 326 to the memory controller 118 as indicated in block 410.

After the write request is sent to the memory controller, the write engine 304 determines if all write requests, which are based on the user programmed control register 314, have been posted to the memory controller. If all of the requests have been posted, flow proceeds to block 414 where the write engine checks to ensure that no outstanding write acknowledgements still exist. Once all the write acknowledgements have been received, the process ends at block 416. It is noted that once all the writes have been posted, reading is then effected from the same addresses to figure out if there is a mismatch (i.e., a failure of the memory interface 104). It is during reading that it is possible to determine if there is a data mismatch. It is also noted that the writes can be programmed by logic 302 in conjunction with generator 308 to start from a certain address (START ADDRESS) and end at certain address (END ADDRESS).

Alternatively at decision block 412, if not all the write requests have been posted, the flow proceeds to decision block 418 where the write engine 304 determines whether the current write address is equal to an end address. If not, flow proceeds to block 420 where the write addresses incremented by a predetermined programmed value, which is determined by the read/write address generator 308. Alternatively, rather than incrementing write addresses, the write address may be decremented, dependent on the specific write address next programmed by the read/write address generator 308 and the desired addressing sequence. Flow then proceeds back to block 404 where a new write tag and write data pattern based on the next write address is generated. If, at decision block 418, the write address is equal to the end address, thereby signifying that all of the addresses determined by the read/write address generator 308 have been written to, the next write address is then reset to the starting address, which is the same as the initialized write address as set previously at block 402. Flow then proceeds from block 422 back to block 404.

It is noted that the looping sequence of blocks 404, 408, 410, 412, 418, 420, and 422 illustrate a looping mechanism of the write engine that provides an iterative or recursive functionality whereby the virtual memory client may continue to write data pattern sequences to the memories for purposes of testing and tuning the memory interface 104. It is further noted that the addresses determined by the read/write address generator 308 may be all in the same memory device (e.g., memory 108), in two or more different memory devices (e.g., memory 108 and memory 110), in the same "channel", which may contain memory addresses in one memory or multiple memory devices, or in different channels, which may include memory addresses in one or more of the memory devices.

Figure 5:
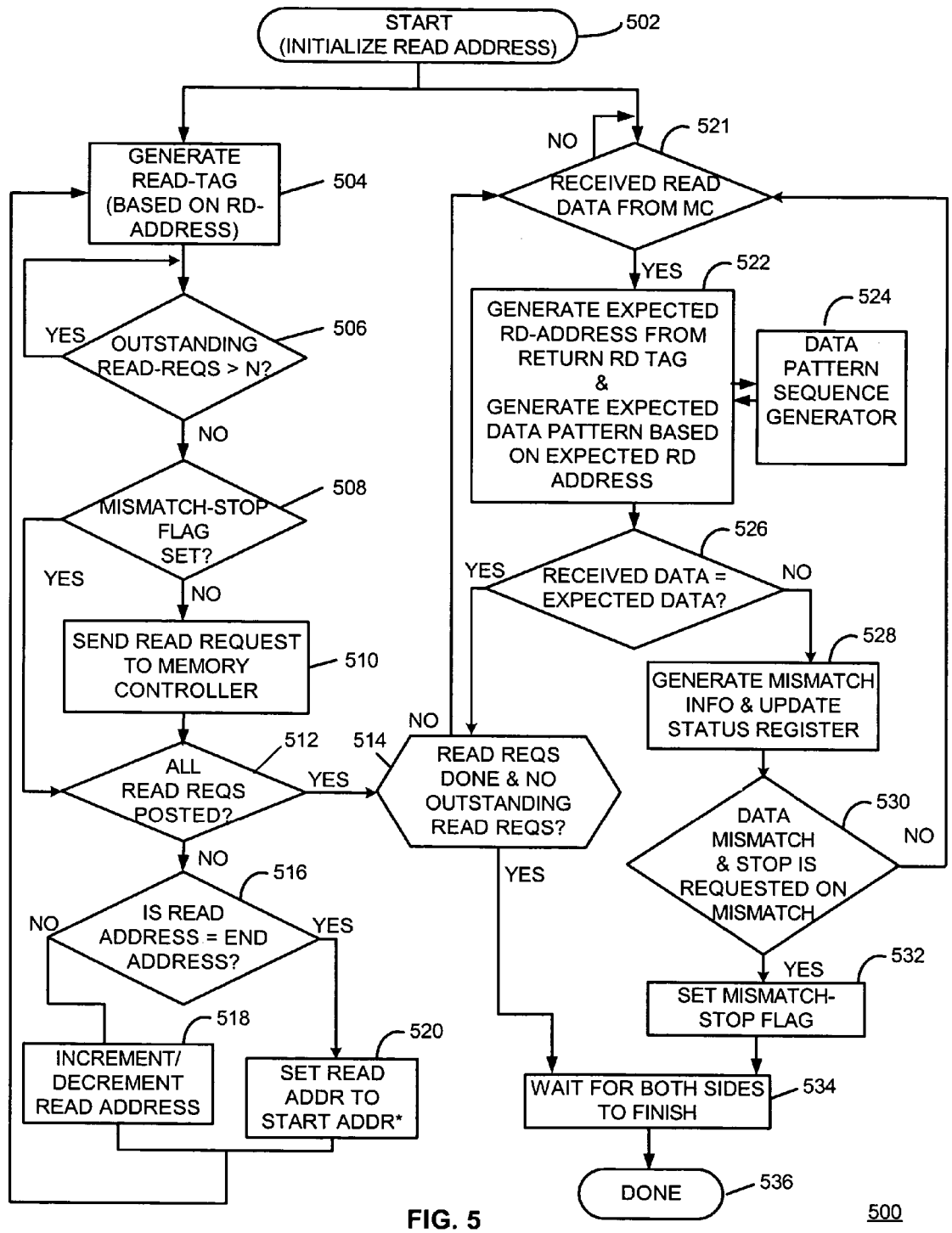
FIG. 5 is a flow diagram of the operation of a read engine used in the virtual memory client of FIG. 2.

The virtual memory client logic 136 also includes a read engine for testing data read from the memory devices via the memory interface 104. The process by which the read engine 304 operates is illustrated in FIG. 5. As shown in FIG. 5, a flow diagram 500 begins with a start 502 where a read address is initialized. The flow then proceeds to both blocks 504 and 521 in a parallel fashion where processing of two different operations is performed simultaneously. In block 504, the read engine 306 generates a read tag based on the initial read address. Next, flow proceeds to decision block 506 where the read engine determines whether any outstanding read requests are greater than a number N. Similar to the write engine flow in FIG. 4, the read engine 304 checks in block 506 to ensure that a predefined number of read requests is not outstanding before proceeding. If the number of read requests does not exceed the number N flow proceeds to decision block 508. It is noted that the number N in the present example of FIG. 5 may be 255 based on the read buffering capabilities of the memory controller but could also be lesser or greater. It is also noted that read-engine 304 has to generate unique tags for all outstanding read-requests, therefore having bigger value of N would require more complex logic to generate unique tags.

At decision block 508, the read engine 306 determines whether a mismatch stop flag has been set by the mismatch information generator 310. The mismatch-stop-flag is initially set as part of generating mismatch information as indicated at block 528. If the mismatch stop flag is not set as determined in block 508, flow proceeds to block 510 where the read engine 306 sends a read request 328 to the memory controller 118. Alternatively, if the mismatch stop flag is set, then sending of the read request is skipped and flow proceeds to block 512. At decision block 512, the read engine 306 determines whether all read requests have been posted. If so, the flow reverts to block 514, which will be discussed later. In the alternative, flow proceeds to decision block 516 where the read engine 306 determines whether the current read address is equal to an end address, which is set by the read/write address generator 308. If not, flow proceeds to block 518 where the read address is either incremented or decremented, dependent on the selected series of read addresses set by the generator 308. Alternatively, if the read engine 306 determines at block 516 that the current read address is equal to the end address, flow proceeds to block 520 where the read address is reset to the initial starting address.

As shown in FIG. 5, flow proceeds back to block 504 from either block 518 or 520, where a new read tag is generated based on the next read address. It is noted that the series of operations in blocks 504, 506, 508, 510, 512, 516, 518 and 520 constitute a looping mechanism for iteratively or recursively reading data pattern sequences from the memory devices in order to test and tune the memory interface 104.

Consecutive with this looping mechanism, the read engine 306 also generates expected read addresses and expected data pattern sequences based on the expected read addresses as illustrated in block 522 after determining at block 521 whether data has been received from the memory controller 104. The data is read from bus 330 into the VMC logic 136 and read engine 306 in logic 136. Additionally as shown at block 521, the read engine 306 continues to poll or wait the memory controller 118 if no data is read until read data is present on bus 330. The expected read addresses (RD-ADDRESS), in particular, are generated from returned read tags that have are sent at block 510 in the parallel looping mechanism process, discussed previously. The expected data pattern sequences are requested from and returned by the data pattern generator 312 as indicated at block 524.

The read engine 306 next compares the received read data received at block 521 with the generated expected data generated at block 522 shown at block 526. If the data are equal or match, flow proceeds to block 514. At block 514 the read engine 306 determines whether all of the read requests are done and whether any outstanding read requests are remaining. If read requests are still outstanding, flow proceeds back to block 521 where additional read data from the memory controller continues to be received by the read engine 306. In the alternative, if the read requests are finished and no outstanding read requests remain, flow proceeds to block 534 where the read engine waits until other operations have finished.

If, at decision block 526, the received data does not match the generated expected data, flow proceeds to block 528 where the read engine 306 will trigger the mismatch information generator 310 to generate mismatch information, which, in turn, updates the status register 316. After block 528, flow proceeds to decision block 530 where the read engine 306 determines whether a data mismatch and stop is requested on the mismatch. The reason for this determination is to allow analysis of the mismatch. If the stop is not requested at block 530, flow proceeds back to block 521 where data continues to be read from the memory controller from bus 330 by the read engine 306 in logic 136. Alternatively, if the stop is requested at block 530, flow proceeds to block 532 and the read engine 306 directs setting a mismatch stop flag. After the flag is set, flow proceeds to block 534 where the read engine waits until the affirmative condition of block 514 is met. Once the conditions of 514 and 532 have been met, the read engine process is finished as indicated by block 536.

Turning back to FIGS. 1 and 3, it is noted that the mismatch information generator 310 in each virtual memory client may issue a mismatch signal to a signaling device such as diode 142, discussed previously. The use of the diode 142 for tuning the memory interface 104 allows a user to adjust different parameters such as the memory clock frequency, voltage levels, ambient temperature or internal parameters while the virtual memory clients are working in one or both of the read and write looping mechanisms, discussed above in connection with FIGS. 4 and 5. If more than one virtual memory client is being used, the mismatch signals from two or more of the virtual memory clients may be ORed together, as indicated by OR gate 144 in FIG. 1 and sent to a pad 146 that drives the signaling device, such as the light emitting diode 142. It can be used to trigger a continuously recording external signal recording device (oscilloscope w/memory) to stop recording, thus capturing what the signal waveform looks like when it fails.

Each of the virtual memory clients may also include automated tuning of the delay lines and pad drive strengths with programming within virtual memory client control logic 302. For this purpose, FIG. 3 illustrates that the virtual memory control logic 302 issues controlled programming information to the memory interface via bus 332 that directs the memory controller 118 to change parameters of the memory interface 104. The control logic 302 may tune the write and read delays of the particular pads in the series of pads 105 in the memory interface 104 as well as the strength values. The tuning process is iterative and repeats until the memory interface 104 is tuned such that no mismatch is registered within the virtual memory client.

Figure 6:
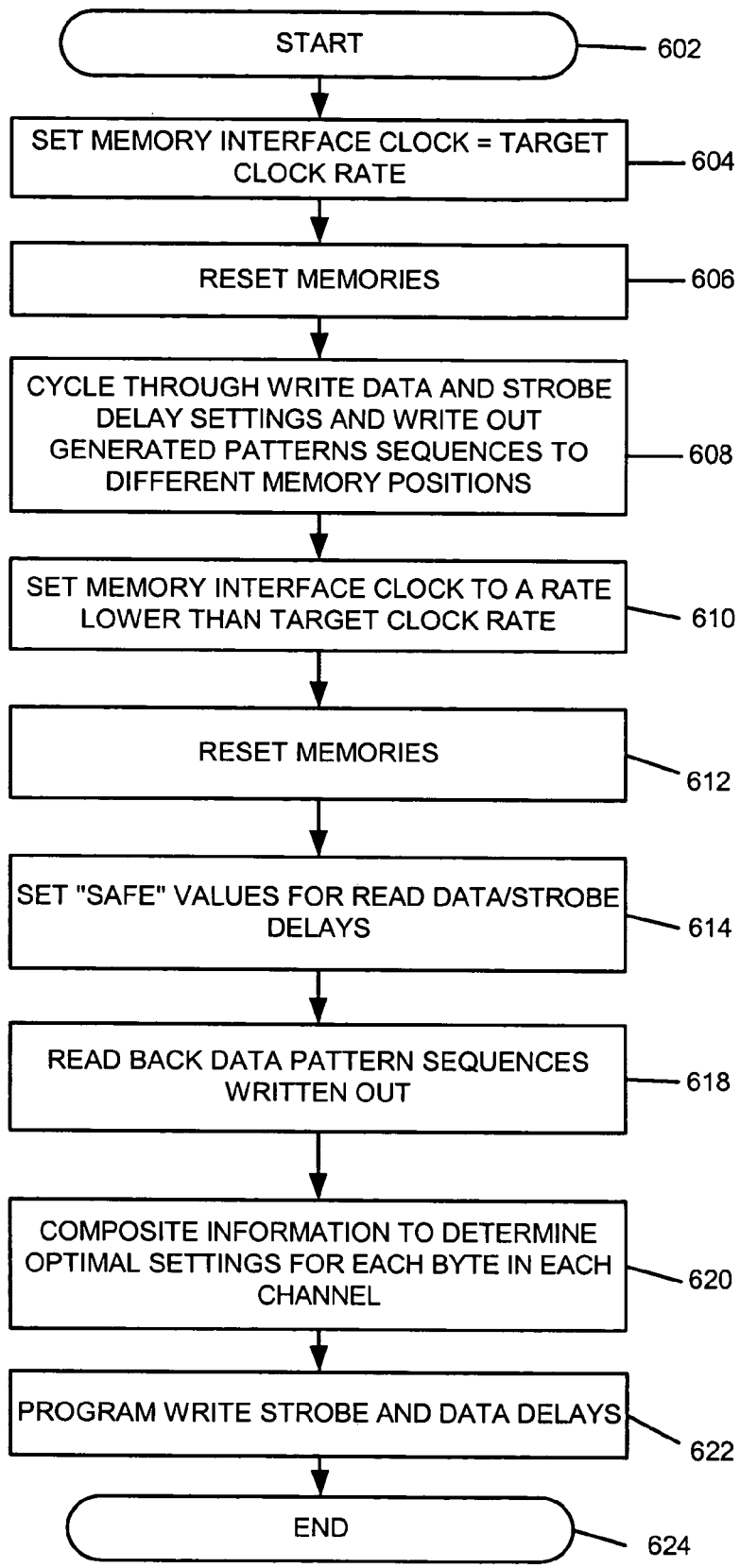
FIG. 6 illustrates a flow diagram of a method for tuning write data and strobe delays in a memory interface in accordance with an example in the present disclosure.

FIG. 6 illustrates an exemplary process by which the virtual memory client logic 302 tunes the write data and accompanying strobe delays. In the present example, this tuning is performed prior to tuning the read data and strobe delays, but it is noted that one of ordinary skill in the art may contemplate tuning only the write data and accompanying strobe delays or the read and accompanying strobe delays, or tune the read data and strobe delays prior to the write data and strobe delays.

As shown in FIG. 6, a flow diagram 600 begins at block 602. At block 604, the clock of the memory interface is set to a desired target clock rate. Next, at block 606, the control logic 302 directs the memory controller 118 to synchronize (i.e., reset) the memory devices. The logic 302 then directs the memory controller 118 to cycle through various write data and strobe delay settings and also write out the generated pattern sequences from write engine 304 to different memory positions or locations as indicated at block 608. The control logic 302 then directs the memory controller 118 to set the memory interface clock to a clock rate lower than the target clock rate. The reason for reducing the clock rate ensures that data to be read will be accurate and without errors.

In block 612, the memories are once again reset as shown in block 612, and "safe" values (i.e., values where the likelihood of mismatches is greatly reduced) are set for the read data and strobe delays as indicated at block 614. The data pattern sequences are then read back from the memories via the interface 104 to the virtual memory control logic 302 via the read engine 306 as indicated at block 618. These data pattern sequences are the sequences written out previously at block 608. The control logic 302 then determines a composite information based on any mismatched information that is determined by the read engine 306 in conjunction with the mismatch information generator 310. This composite information is then used by the logic 302 to communicate an optimal setting for each byte in each channel for the write strobe and data delays as indicated in block 620. The memory controller 118 then programs the individual write strobe and data delays received from the control logic 302 within the memory interface 104 as indicated in block 622. Once the write strobe and data delays in the memory interface are set, the write tuning procedure ends as indicated at block 624.

Figure 7:
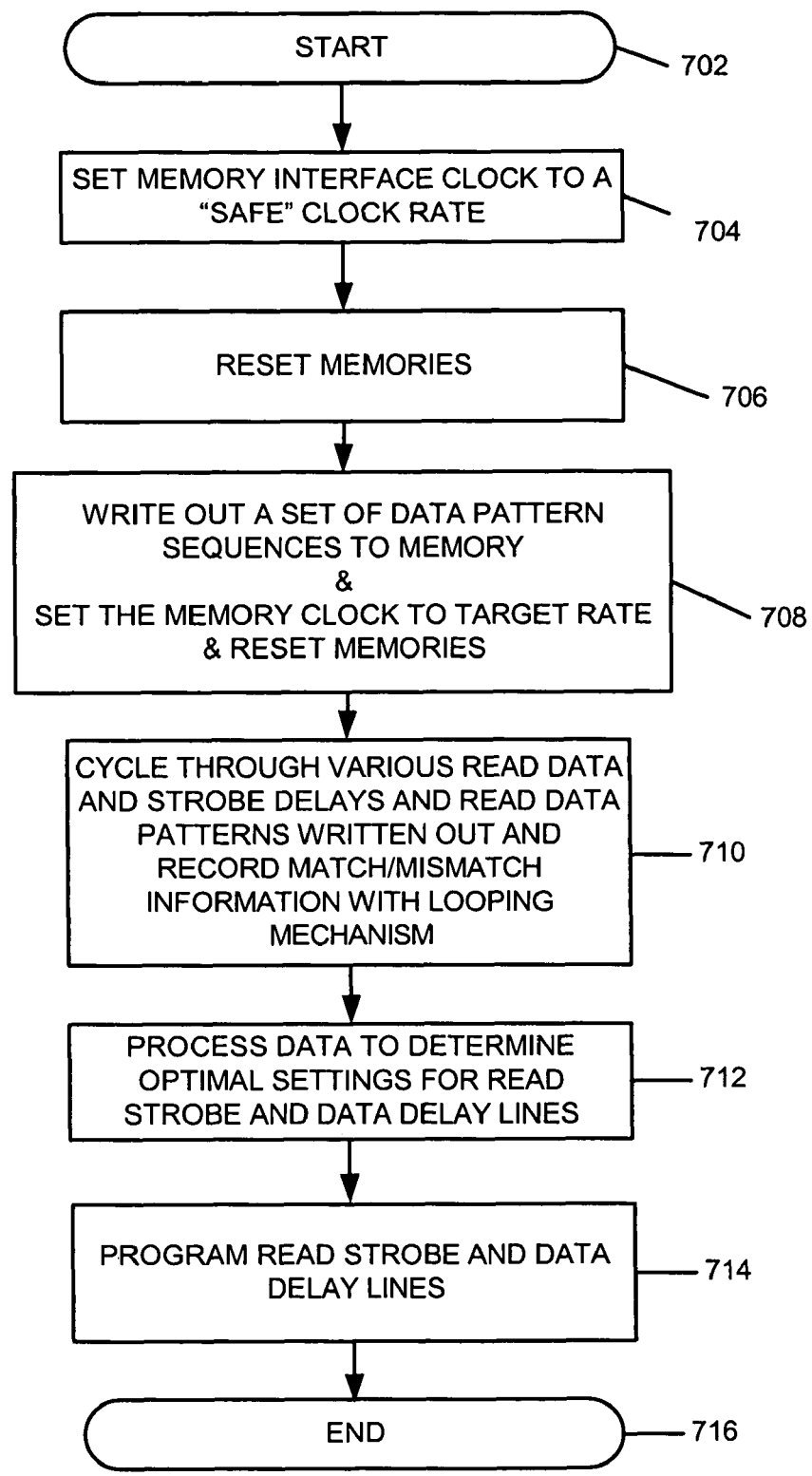
FIG. 7 is a flow diagram of a method for tuning read data/strobe delays in a memory interface in accordance with and example in the present disclosure.

FIG. 7 illustrates an exemplary procedure performed by the control logic 302 to tune the read data and strobe delays within the memory interface 104. As shown in the flow diagram 700, the procedure is initialized at block 702. After initialization, the control logic 302 directs the memory controller 118 via bus 332 to set the memory interface clock to a target clock rate as indicated in block 704. The control logic 302 then directs the memory controller 118 to reset the memory devices at block 706. After the memories are reset, the write engine 304 writes out a set of data pattern sequences to the memory or memories via bus 326 as shown in block 708. The memory controller 118, based on control signals from the control logic 302, then cycles through various read data and strobe delays as shown in block 710. Additionally, as the memory controllers cycling through the various read data and strobe delays, the read engine 306 reads back the data pattern sequences written out to the memories in block 708. Moreover at block 710, the read engine 306 via the mismatch information generator 310 records data match and mismatch information.

From the recorded match and mismatch information, the control logic 302 then processes this information in order to determine optimal settings for the read strobe and data delay lines as indicated at block 712. The control logic 302 then directs the memory controller 118 to program the read strobe and data delay lines via bus 332 to the optimal value determined in block 712. Once the read data and strobe delays are set, the procedure ends at block 716.

It is also noted that after setting the write and read data and strobe delays using the procedures of FIGS. 6 and 7, for example, the virtual memory client control logic 302 may then signal the memory controller 118 to set the final clock rate, which will preferably be close to or equal to the target clock rate.

Although the presently disclosed system employing programmable virtual memory clients is described in the context of tuning a memory interface, such as memory interface 104, one of ordinary skill in the art will appreciate that the pre-programmable virtual memory clients may also be used to test the memory devices (108, 110, 112 and 114, for example) themselves. In such case, a user would define start and end addresses within the read/write address generator 308 to utilize all available memory space in a particular channel. Each of the virtual memory clients would then target only a respective signal channel and all four of the virtual memory clients could then be run to cover all four channels.

It is also noted that one of ordinary skill in the art may contemplate programming the virtual memory client to generate even more variations in the data pattern sequences. For example, the first virtual memory client 120 would write into a row of addresses in a memory 108, the second virtual memory client 122 into the next row of addresses of the memory 108, the third virtual memory client writing into a next row of addresses, and so on.

The above detailed description of the examples described therein has been presented for the purposes of illustration and description only and not by limitation. It is therefore contemplated that the present application cover any and all modifications, variations or equivalent the fall within the spirit and scope of the basic underlying principles disclosed above and the appended claims.

What is claimed is:

1. An integrated circuit comprising:
  memory test logic comprising:
    at least one programmable virtual memory client that includes:
      programmable control logic configured to generate a plurality of bursts, each burst including at least one data pattern sequence generated from a plurality of stored data patterns;
      virtual memory client control logic configured to:
        use the generated bursts to at least one of read from and write to at least one memory device;
        based on mismatch information generated based on the bursts, generate controlled programming information that causes changing of parameters of a memory interface that comprises a plurality of pads on the integrated circuit;
        issue the controlled programming information to the memory interface;
        based on the controlled programming information, automatically tune the memory interface by automatically adjusting a write and/or read delay of at least one of the pads and by automatically updating a signal strength level of at least one of the plurality of pads;
      wherein the virtual memory client control logic tunes write data and accompanying strobe delays by adjusting the write delay of at least one of the pads and updating a signal strength level having at least one of a plurality of pads used to write the data; and wherein the virtual memory client control logic is further operative to:
        cycle through a plurality of write and/or read data and strobe delay settings to determine a desired setting for the tuning process; and
      repeat the tuning process until no data mismatches are determined.

2. The integrated circuit as defined in claim 1, wherein the memory test logic further comprises:
  a programmable address generator configured to generate at least one of a read and write address to one or more memory devices.

3. The integrated circuit as defined in claim 1, wherein the virtual memory control logic is further configured to execute a looping routine where the virtual memory client continuously reads data patterns between predefined starting and ending memory addresses.

4. The integrated circuit as defined in claim 3, wherein the virtual memory client control logic is further configured to determine an expected read data pattern sequence and compares the read data pattern sequence with the expected read data pattern sequence and determines whether a data mismatch has occurred based on the comparison.

5. The integrated circuit as defined in claim 3, wherein the virtual memory client further includes a mismatch information generator configured to determine mismatches between data written to the at least one memory and data received from the at least one memory during the looping routine.

6. The integrated circuit as defined in claim 5, wherein the virtual memory client is operative to issue a signal indicating failure of at least one of writes and reads to the memory when a mismatch is determined.

7. An integrated circuit comprising:
  a memory interface, comprising a plurality of pads, the memory interface configured to read and write data to at least one memory device;
  a memory controller configured to control the memory interface;
  at least one virtual memory access client connectable to the memory controller, the virtual memory access client including:
    programmable control logic configured to generate a plurality of bursts, each burst including at least one data pattern sequence generated from a plurality of stored data patterns, and
    virtual memory client control logic configured to:
      use the generated burst to at least one of read from and write to the at least one memory device;
      based on mismatch information generated based on the bursts, generate controlled programming information that causes changing of parameters of the memory interface;
      issue the controlled programming information to the memory interface;
      based on the controlled programming information, automatically tune the memory interface by automatically adjusting a write and/or read delay of at least one of the pads and by automatically updating a signal strength level of at least one of the plurality of pads;
    wherein the virtual memory client control logic tunes write data and accompanying strobe delays by adjusting the write delay of at least one of the pads and updating a signal strength level having at least one of a plurality of pads used to write the data; and wherein the virtual memory client control logic is further operative to:

cycle through a plurality of write and/or read data and strobe delay settings to determine a desired setting for the tuning process; and
repeat the tuning process until no data mismatches are determined.

8. The integrated circuit as defined in claim 7, further comprising:
a pre-programmable data register configured to receive programming of the plurality of stored data patterns.

9. The integrated circuit as defined in claim 7, wherein the at least one programmable virtual memory client further includes a programmable address generator configured to generate at least one of a read and write address to the at least one memory device.

10. The integrated circuit as defined in claim 7, wherein the virtual memory client control logic is further configured to execute a looping routine where the programmable virtual memory client continuously reads data patterns between pre-defined starting and ending memory addresses.

11. The integrated circuit as defined in claim 10, wherein the virtual memory client control logic is further configured to determine an expected read data pattern sequence and compares the read data pattern sequence with the expected read data pattern sequence and determines whether a data mismatch has occurred based on the comparison.

12. The integrated circuit as defined in claim 9, wherein the programmable virtual memory client further includes a mismatch information generator configured to determine mismatches between data written to the at least one memory and data received from the at least one memory during the looping routine and issue a signal indicating failure of the memory interface when a mismatch is determined.

13. The integrated circuit as defined in claim 12, further comprising a signaling device responsive to the signal indicating failure of the memory interface.

14. A method for testing a memory comprising:
generating a plurality of bursts on an integrated circuit, each burst comprising at least one data pattern sequence generated from a plurality of stored data patterns;
writing and reading the bursts from and to at least one memory device;
based on mismatch information generated based on the bursts, generating controlled programming information that causes changing of parameters of a memory interface that comprises a plurality of pads on the integrated circuit;
issuing the controlled programming information to the memory interface; and
based on the controlled programming information, using control logic on the integrated circuit to automatically tune the memory interface by adjusting a write and/or read delay of at least one of the pads and by updating a signal strength level of at least one of the plurality of pads;
setting a clock rate of the memory interface to a target clock rate;
at the target clock rate, cycling through a plurality of write data and strobe delay settings when writing the bursts to the at least one memory device;
after cycling, setting the clock rate of the memory interface to a safe clock rate substantially lower than the target clock rate; and
at the safe clock rate, reading the bursts from the at least one memory device.

15. The method as defined in claim 14, further comprising:
executing a looping routine that continuously reads data pattern sequences between predefined starting and ending memory addresses;
determining an expected read value;
comparing the read data pattern sequence with the expected read data pattern sequence; and
determining whether a data mismatch has occurred based on the comparison.

16. The method as defined in claim 14, further comprising:
determining an expected read data pattern sequence; and
comparing a read data pattern sequences to the expected read data pattern sequence to determine whether a data mismatch has occurred.

17. The method as defined in claim 16, further comprising:
issuing a signal indicating failure of at least one of writes and reads to the memory when a mismatch is determined.

18. The integrated circuit of claim 1, wherein the programmable control logic comprises a data pattern generator and programmable control register operably coupled to the data pattern generator wherein the data pattern generator is operative to assemble a plurality of stored data patterns into the data pattern sequence and produce a generated burst.

19. An integrated circuit comprising:
a memory interface, comprising a plurality of pads, configured to read and write data to at least one memory device;
a memory controller configured to control the memory interface; and
at least one virtual memory access client connectable to the memory controller, the virtual memory access client including:
programmable control logic configured to generate at least one data pattern sequence from a plurality of stored data patterns, and
virtual memory client control logic configured to:
use the generated at least one data pattern sequence to at least one of read from and write to the at least one memory device;
based on mismatch information generated based on the data pattern sequence that was generated, generate controlled programming information that causes changing of parameters of the memory interface;
issue the controlled programming information to the memory interface; and
based on the controlled programming information, automatically tune the memory interface by automatically adjusting a write and/or read delay of at least one pad in the memory interface and by automatically adjusting a signal strength level of at least one pad in the memory interface;
wherein the virtual memory client control logic tunes write data and accompanying strobe delays by adjusting the write delay of at least one of the pads and updating a signal strength level having at least one of a plurality of pads used to write the data; and wherein the virtual memory client control logic is further operative to:
cycle through a plurality of write and/or read data and strobe delay settings to determine a desired setting for the tuning process; and
repeat the tuning process until no data mismatches are determined.

20. A method for testing a memory comprising:
generating a plurality of bursts on an integrated circuit, each burst comprising at least one data pattern sequence generated from a plurality of stored data patterns;
writing and reading the bursts from and to at least one memory device;
based on mismatch information generated based on the bursts, generating controlled programming information that causes changing of parameters of a memory interface that comprises a plurality of pads on the integrated circuit;
issuing the controlled programming information to the memory interface;
based on the controlled programming information, using control logic on the integrated circuit to automatically tune the memory interface by adjusting a write and/or read delay of at least one of the pads and by updating a signal strength level of at least one of the plurality of pads;
setting a clock rate of the memory interface to a safe clock rate;
at the safe clock rate, writing the bursts to the at least one memory device;
after writing, setting the clock rate of the memory interface to a target clock rate substantially higher than the safe clock rate; and
at the target clock rate, cycling through a plurality of read data and strobe delay settings when reading the bursts from the at least one memory device.

* * * * *